(12) United States Patent
Chai

(10) Patent No.: US 9,454,051 B2
(45) Date of Patent: Sep. 27, 2016

(54) DISPLAY PANEL AND DISPLAY DEVICE

(71) Applicant: Shenzhen China Star Optoelectronics Technology Co., Ltd., Guangdong (CN)

(72) Inventor: Li Chai, Guangdong (CN)

(73) Assignee: Shenzhen China Star Optoelectronics Technology Co., Ltd., Shenzhen (CN)

( * ) Notice: Subject to any disclaimer, the term of this patent is extended or adjusted under 35 U.S.C. 154(b) by 160 days.

(21) Appl. No.: 14/402,355

(22) PCT Filed: Aug. 6, 2014

(86) PCT No.: PCT/CN2014/083779
§ 371 (c)(1),
(2) Date: Nov. 20, 2014

(87) PCT Pub. No.: WO2016/008184
PCT Pub. Date: Jan. 21, 2016

(65) Prior Publication Data
US 2016/0252791 A1 Sep. 1, 2016

(30) Foreign Application Priority Data
Jul. 17, 2014 (CN) .......................... 2014 1 0341497

(51) Int. Cl.
| | | |
|---|---|---|
| H01L 33/16 | (2010.01) | |
| G02F 1/1362 | (2006.01) | |
| H01L 27/12 | (2006.01) | |
| H01L 29/786 | (2006.01) | |
| G02F 1/1368 | (2006.01) | |
| G02F 1/1343 | (2006.01) | |
| G02F 1/1333 | (2006.01) | |

(52) U.S. Cl.
CPC ....... *G02F 1/136286* (2013.01); *G02F 1/1368* (2013.01); *G02F 1/13624* (2013.01); *G02F 1/133345* (2013.01); *G02F 1/134309* (2013.01); *H01L 27/124* (2013.01); *H01L 27/1222* (2013.01); *H01L 29/78669* (2013.01); *G02F 2001/134345* (2013.01); *G02F 2202/103* (2013.01)

(58) Field of Classification Search
CPC .......... H01L 27/1214; H01L 27/3272; H01L 27/3244; H01L 29/66742; H01L 29/4908; H01L 29/42384; H01L 29/78669; H01L 29/78666
USPC ................................. 257/59–60, 72
See application file for complete search history.

(56) References Cited

U.S. PATENT DOCUMENTS

| | | | |
|---|---|---|---|
| 2008/0048999 | A1 | 2/2008 | Chiang et al. |
| 2008/0143900 | A1 | 6/2008 | Tsao et al. |
| 2009/0102773 | A1 | 4/2009 | Um et al. |
| 2012/0281168 | A1 | 11/2012 | Shimoshikiryoh et al. |
| 2013/0270567 | A1* | 10/2013 | Wu .................... H01L 27/1214 257/59 |

FOREIGN PATENT DOCUMENTS

| | | |
|---|---|---|
| CN | 101216646 | 7/2008 |
| CN | 101501561 | 8/2009 |

OTHER PUBLICATIONS

International Search Report and the Written Opinion Dated Apr. 29, 2015 From the State Intellectual Property Office of the People's Republic of China Re. Application No. PCT/CN2014/083779 and Its Translation of Search Report in English.

* cited by examiner

*Primary Examiner* — Cuong Q Nguyen

(57) ABSTRACT

A display panel is provided, which comprises a plurality of the pixel units. Each of the pixel units comprises a main pixel portion having a first thin film transistor and a sub-pixel portion having a second thin film transistor, wherein a second distance is unequal to a first distance. Insulation layers of the two pixel portions are designed to be different thicknesses, so that a color cast problem from a large viewing angle is solved, so as to improve the watching effect, and lower the production cost.

17 Claims, 4 Drawing Sheets

DISPLAY PANEL AND DISPLAY DEVICE

RELATED APPLICATIONS

This application is a National Phase of PCT Patent Application No. PCT/CN2014/083779 having International filing date of Aug. 6, 2014, which claims the benefit of priority of Chinese Patent Application No. 201410341497.3 filed on Jul. 17, 2014. The contents of the above applications are all incorporated by reference as if fully set forth herein in their entirety.

FIELD OF THE INVENTION

The present invention relates to a technological field of displays, and more particularly to a display panel and a display device.

BACKGROUND OF THE INVENTION

With the rapid development of the liquid crystal panel industry, the size of the panels have become larger, the power consumption of the display is increased, and a color cast problem from a large viewing angle has been produced. Therefore, the requirements of a wide view point and low energy consumption for the design of the display have increased. In order to respond to the problems arising from large size liquid crystal displays, kinds of design for a thin film transistor (TFT) device and pixels have been developed.

To solve this color cast problem from a large viewing angle, as shown in FIG. 1, a thin film transistor is added into the existing technology, and a sharing capacitor is controlled to be in a condition either on or off by the thin film transistor. When a thin film transistor of a main pixel portion is switched off, the sharing capacitor is switched on, and the voltage of a liquid crystal capacitor of a sub-pixel portion is lowered by the sharing capacitor, so as to solve the color cast problem from a large viewing angle. However, the structure of the design of the above-mentioned pixel is complex, and causes the aperture ratio thereof to be lowered, and the production cost is higher.

SUMMARY OF THE INVENTION

One of the objects of the present invention is to provide a display panel which can solve a color cast problem from a large viewing angle without decreasing the aperture ratio thereof, so as to improve the watching effect, and lower the production cost.

For solving the above-mentioned technological problem, the present invention constructs a display panel, which comprises an array substrate;

wherein the array substrate comprises data lines, scan lines, and a plurality of pixel units formed by crisscrossing the data lines and scan lines;

wherein each of the pixel units comprises:

a main pixel portion having a first thin film transistor, wherein a first insulation layer is disposed between a first grid electrode of the first thin film transistor and a first source electrode and a first drain electrode of the first thin film transistor; and the first source electrode is connected to the first drain electrode through a semiconductor layer;

a sub-pixel portion having a second thin film transistor, wherein a second insulation layer is disposed between a second grid electrode of the second thin film transistor and a second source electrode and a second drain electrode of the second thin film transistor; and the second source electrode is connected to the second drain electrode through another semiconductor layer;

wherein a second distance is larger than a first distance; a ratio of the second distance to the first distance is in the range of 1.25-2; the first distance is a thickness of the first insulation layer which is between the first grid electrode of the first thin film transistor and the semiconductor layer of the first thin film transistor; and the second distance is a thickness of the second insulation layer which is between the second grid electrode of the second thin film transistor and the semiconductor layer of the second thin film transistor.

In the display panel of the present invention, the first insulation layer is formed by a thinning operation on the second insulation layer.

In the display panel of the present invention, the material of the semiconductor layer is an amorphous silicon material.

For solving the above-mentioned technological problem, the present invention constructs a display panel, which comprises an array substrate;

wherein the array substrate comprises data lines, scan lines, and a plurality of pixel units formed by crisscrossing the data lines and scan lines;

wherein each of the pixel units comprises:

a main pixel portion having a first thin film transistor, wherein a first insulation layer is disposed between a first grid electrode of the first thin film transistor and a first source electrode and a first drain electrode of the first thin film transistor; and the first source electrode is connected to the first drain electrode through a semiconductor layer; and a sub-pixel portion having a second thin film transistor, wherein a second insulation layer is disposed between a second grid electrode of the second thin film transistor and a second source electrode and a second drain electrode of the second thin film transistor; and the second source electrode is connected to the second drain electrode through another semiconductor layer;

wherein a second distance is unequal to a first distance; the first distance is a thickness of the first insulation layer which is between the first grid electrode of the first thin film transistor and the semiconductor layer of the first thin film transistor; and the second distance is a thickness of the second insulation layer which is between the second grid electrode of the second thin film transistor and the semiconductor layer of the second thin film transistor.

In the display panel of the present invention, the second distance is larger than the first distance.

In the display panel of the present invention, the first insulation layer is formed by a thinning operation on the second insulation layer.

In the display panel of the present invention, the second distance is smaller than the first distance.

In the display panel of the present invention, the second insulation layer is formed by a thinning operation on the first insulation layer.

In the display panel of the present invention, a ratio of the second distance to the first distance is in the range of 0.5-2.

In the display panel of the present invention, the material of the semiconductor layer is an amorphous silicon material.

Another one of the objects of the present invention is to provide a display device. The display device comprises a display panel, wherein the display panel comprises an array substrate;

wherein the array substrate comprises data lines, scan lines, and a plurality of pixel units formed by crisscrossing the data lines and scan lines;

wherein each of the pixel units comprises:

a main pixel portion having a first thin film transistor, wherein a first insulation layer is disposed between a first grid electrode of the first thin film transistor and a first source electrode and a first drain electrode of the first thin film transistor; and the first source electrode is connected to the first drain electrode through a semiconductor layer; and a sub-pixel portion having a second thin film transistor, wherein a second insulation layer is disposed between a second grid electrode of the second thin film transistor and a second source electrode and a second drain electrode of the second thin film transistor; and the second source electrode is connected to the second drain electrode through another semiconductor layer;

wherein a second distance is unequal to a first distance; the first distance is a thickness of the first insulation layer which is between the first grid electrode of the first thin film transistor and the semiconductor layer of the first thin film transistor; and the second distance is a thickness of the second insulation layer which is between the second grid electrode of the second thin film transistor and the semiconductor layer of the second thin film transistor.

In the display device of the present invention, the second distance is larger than the first distance.

In the display device of the present invention, the first insulation layer is formed by a thinning operation on the second insulation layer.

In the display device of the present invention, the second distance is smaller than the first distance.

In the display device of the present invention, the second insulation layer is formed by a thinning operation on the first insulation layer.

In the display device of the present invention, a ratio of the second distance to the first distance is in the range of 0.5-2.

In the display device of the present invention, the material of the semiconductor layer is an amorphous silicon material.

The present invention provides a display panel, wherein the insulation layer of the main pixel portion and the sub-pixel portion are designed to be different thicknesses, so that the charge efficiency of the pixel electrode of the main pixel portion and the sub-pixel portion are different, and then the brightness of the pixel of the main pixel portion and the sub-pixel portion are also different, so as to decrease the color cast problem from a large viewing angle, improve the watching effect, and lower the production cost.

DETAILED DESCRIPTION OF THE PREFERRED EMBODIMENTS

Figure 1:
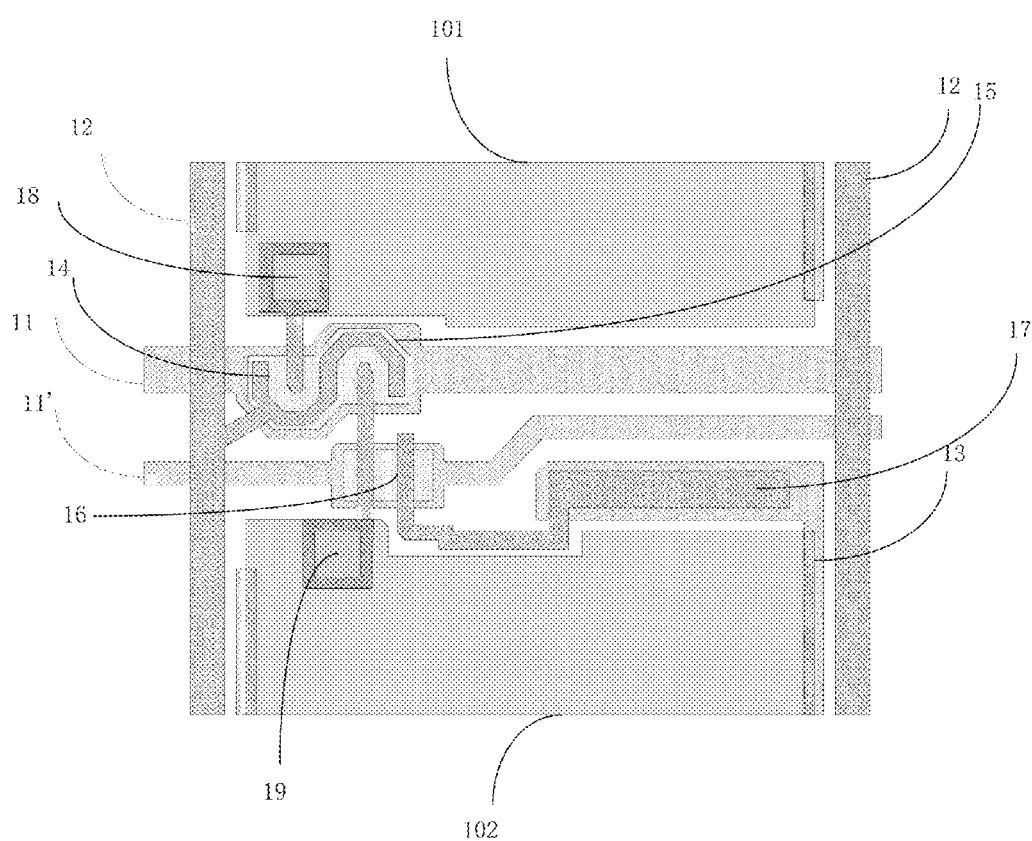
FIG. 1 is a structural schematic view of an array substrate in a traditional technology.

The foregoing objects, features, and advantages adopted by the present invention can be best understood by referring to the following detailed description of the preferred embodiments and the accompanying drawings. Furthermore, the directional terms described in the present invention, such as upper, lower, front, rear, left, right, inner, outer, side, and etc., are only directions with reference to the accompanying drawings, so that the used directional terms are used to describe and understand the present invention, but the present invention is not limited thereto. In the drawings, units with similar structures use the same numerals.

Referring now to FIG. 1, which is a structural schematic view of an array substrate in a traditional technology.

A display panel comprises an array substrate. The array substrate comprises data lines, scan lines, and a plurality of pixel units formed by crisscrossing the data lines and scan lines. FIG. 1 shows a structural schematic view of one of the pixel units. The pixel unit comprises a main pixel portion 101 and a sub-pixel portion 102, wherein the main pixel portion 101 has a first thin film transistor 14; the sub-pixel portion 102 has a second thin film transistor 15 and third thin film transistor 16; and the third thin film transistor 16 is connected to a sharing capacitor 17. The sharing capacitor 17 is formed by a com line 13 and a source electrode of the third thin film transistor.

The main pixel portion 101 comprises a first pixel electrode and a first liquid crystal capacitor formed between the first pixel electrode and a com electrode; and the sub-pixel portion 102 comprises a second pixel electrode and a second liquid crystal capacitor formed between the second pixel electrode and a com electrode.

A first grid electrode of the first thin film transistor 14 is connected to a scan line 11, and a second grid electrode of the second thin film transistor 15 is connected to the same. A first source electrode of the first thin film transistor 14 is connected to a data line 12, and a second source electrode of the second thin film transistor 15 is connected to the same. A grid electrode of the third thin film transistor 16 is connected to a sub scan line 11'. A first drain electrode of the first thin film transistor 14 is connected to the first pixel electrode by a through-hole 18, and a second drain electrode of the second thin film transistor 15 is connected to the second pixel electrode by a through-hole 19. When the first thin film transistor 14 and the second thin film transistor 15 are switched off, the third thin film transistor 16 is switched on, and then a part of electric charges of the second pixel electrode are transferred to the sharing capacitor 17 by the third thin film transistor 16, so that the voltage of the two ends of the second liquid crystal capacitor, which is corresponding to the second pixel electrode, is lower than the voltage of the two ends of the first liquid crystal capacitor. By such a structure, the color cast problem from a large viewing angle is solved.

Figure 2:
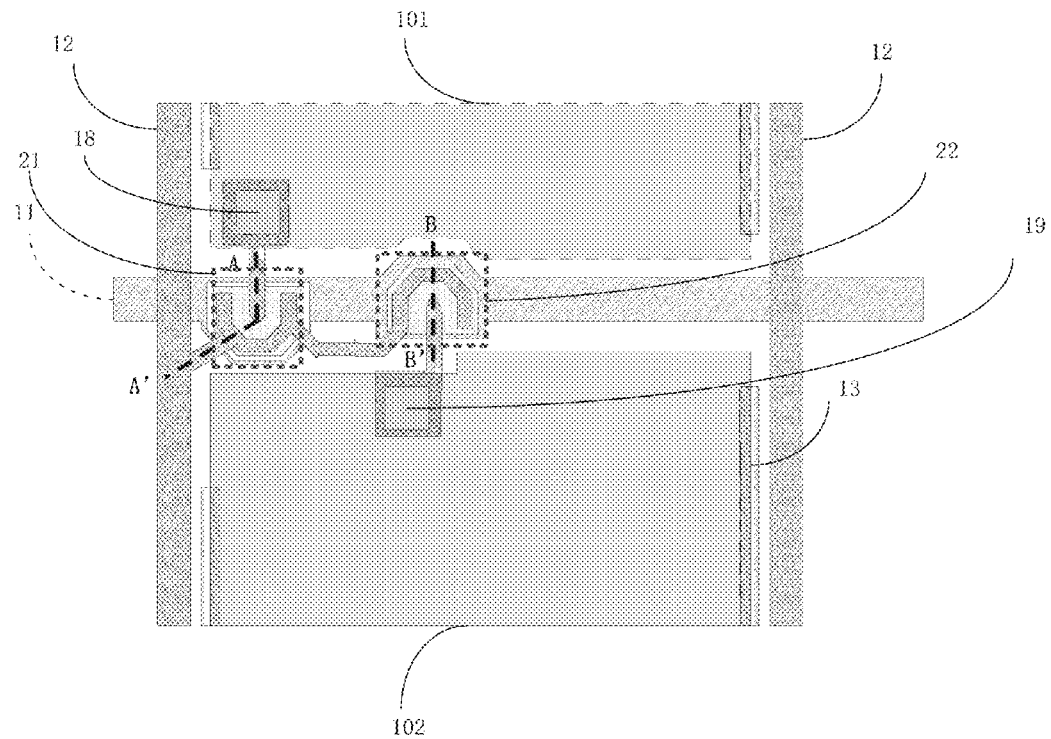
FIG. 2 is a structural schematic view of an array substrate according to a first embodiment of the present invention.

Referring now to FIG. 2, which is a structural schematic view of an array substrate according to a first embodiment of the present invention.

In the technical solution of the present invention, the third thin film transistor 16 and the sharing capacitor 17 of FIG. 1 are omitted. In the embodiment, a display panel comprises an array substrate.

The array substrate comprises data lines, scan lines, and a plurality of pixel units formed by crisscrossing the data lines and scan lines.

Each of the pixel units comprises a main pixel portion 101 and a sub-pixel portion 102.

Figure 3:
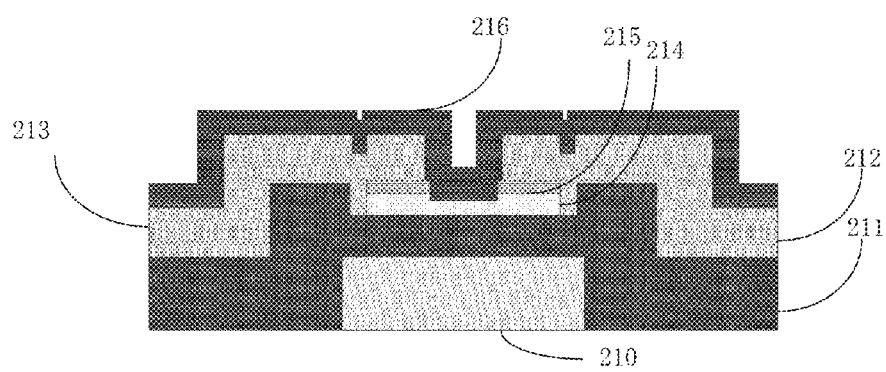
FIG. 3 is a cross-section schematic view along line A-A' in FIG. 2.

Referring to FIG. 3, the main pixel portion 101 has a first thin film transistor 21 and a first pixel electrode, wherein a first insulation layer 211 is disposed between a first grid electrode 210 of the first thin film transistor 21 and a first source electrode 212 and a first drain electrode 213 of the first thin film transistor 21; the first source electrode 212 is connected to the first drain electrode 213 through a semiconductor layer 214; and the material of the semiconductor layer is an amorphous silicon material. Furthermore, an ohmic contact layer 215 is disposed on an upper surface of the semiconductor layer 214, and a passivation layer 216 is disposed on upper surfaces of the first source electrode 212 and the first drain electrode 213.

Figure 4:
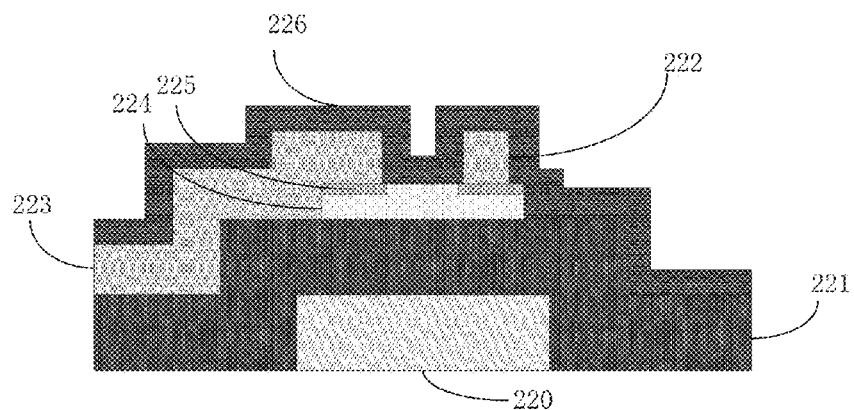
FIG. 4 is a cross-section schematic view along line B-B' in FIG. 2.

Referring to FIG. 4, the sub-pixel portion 102 has a second thin film transistor 22 and a second pixel electrode, wherein a second insulation layer 221 is disposed between a second grid electrode 220 of the second thin film transistor and a second source electrode 222 and a second drain electrode 223 of the second thin film transistor; the second source electrode 222 is connected to the second drain electrode 223 through a semiconductor layer 224; and the material of the semiconductor layer is an amorphous silicon material. Furthermore, an ohmic contact layer 225 is disposed on an upper surface of the semiconductor layer 224, and a passivation layer 226 is disposed on upper surfaces of the second source electrode 222 and the second drain electrode 223.

The first grid electrode of the first thin film transistor 21 is connected to a scan line 11, and the second grid electrode of the second thin film transistor 22 is connected to the same. The first source electrode of the first thin film transistor 21 is connected to a data line 12, and the second source electrode of the second thin film transistor 22 is connected to the same. The first drain electrode of the first thin film transistor 14 is connected to the first pixel electrode by a through-hole 18, and the second drain electrode of the second thin film transistor 15 is connected to the second pixel electrode by a through-hole 19. Additionally, a com line is labeled as 13.

A first distance is a thickness of the first insulation layer 211 which is between the first grid electrode 210 of the first thin film transistor 21 and the semiconductor layer 214 of the first thin film transistor 21. A second distance is a thickness of the second insulation layer 221 which is between the second grid electrode 220 of the second thin film transistor 22 and the semiconductor layer 224 of the second thin film transistor 22, wherein the first distance is unequal to the second distance.

In the preferred embodiment, the second distance is greater than the first distance. As shown in FIG. 3, a thinning operation is processed on the second insulation layer 221 which is between the first grid electrode 210 of the first thin film transistor and the semiconductor layer 214 of the first thin film transistor, so as to form the first insulation layer 211 between the first grid electrode 210 and the semiconductor layer 214 of the first thin film transistor.

The thinning operation can be wet etching or dry etching. After the thinning operation, a ratio of the second distance to the first distance is in the range of 1.25-2. The charge efficiency of the thin film transistor is an inverse ratio of the thickness of the insulation layer, less thickness means more charge efficiency. Therefore, when under the same driving data signal, because the first distance is smaller than the second distance, the voltage of the first pixel electrode of the main pixel portion 101 is greater than the voltage of the second pixel electrode of the sub-pixel portion 102, so that the voltage of a first liquid crystal capacitor of the main pixel portion 101 is greater than the voltage of a second liquid crystal capacitor of the sub-pixel portion 102. Therefore, the brightness of the pixel of the main pixel portion 101 is different from the brightness of the pixel of the sub-pixel portion 102, so as to solve the color cast problem from a large viewing angle.

Another method to achieve the embodiment is that a thickening operation is processed on the second insulation layer which is between the first grid electrode and the semiconductor layer of the first thin film transistor, so as to form the first insulation layer between the first grid electrode and the semiconductor layer of the first thin film transistor. The thickening operation can be deposition or sputter. After the thickening operation, the second distance is smaller than the first distance, and a ratio of the second distance to the first distance is in the range of 0.56-0.77.

The present invention provides a display panel, wherein the insulation layers of the main pixel portion and the sub-pixel portion are designed to be different thicknesses, so that the charge efficiency of the pixel electrode of the main pixel portion and the sub-pixel portion are different, and then the brightness of the pixel of the main pixel portion and the sub-pixel portion are also different, so as to decrease the color cast problem from a large viewing angle, improve the watching effect, and lower the production cost.

Figure 5:
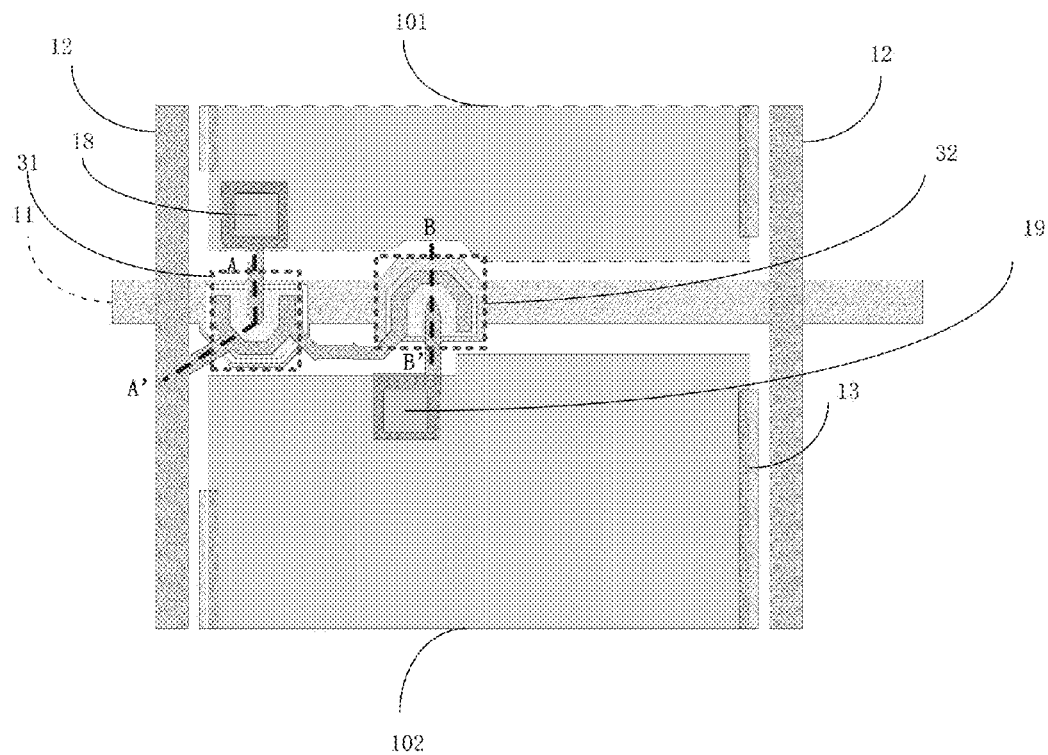
FIG. 5 is a structural schematic view of an array substrate according to a second embodiment of the present invention.

Referring now to FIG. 5, which is a structural schematic view of an array substrate according to a second embodiment of the present invention.

In the technical solution of the present invention, the third thin film transistor 16 and the sharing capacitor 17 of FIG. 1 are omitted. In the embodiment, a display panel comprises an array substrate.

The array substrate comprises data lines, scan lines, and a plurality of pixel units formed by crisscrossing the data lines and scan lines.

Each of the pixel units comprises a main pixel portion 101 and a sub-pixel portion 102.

Figure 6:
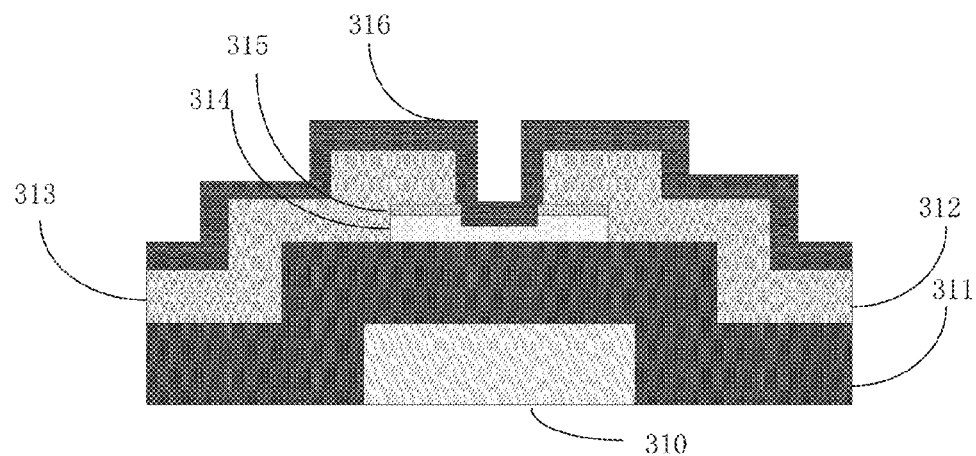
FIG. 6 is a cross-section schematic view along line A-A' in FIG. 5.

Referring to FIG. 6, the main pixel portion 101 has a first thin film transistor 31 and a first pixel electrode, wherein a first insulation layer 311 is disposed between a first grid electrode 310 of the first thin film transistor 31 and a first source electrode 312 and a first drain electrode 313 of the first thin film transistor 31; the first source electrode 312 is connected to the first drain electrode 313 through a semiconductor layer 314; and the material of the semiconductor layer is an amorphous silicon material. Furthermore, an ohmic contact layer 315 is disposed on an upper surface of the semiconductor layer 314, and a passivation layer 316 is disposed on upper surfaces of the first source electrode 312 and the first drain electrode 313.

Figure 7:
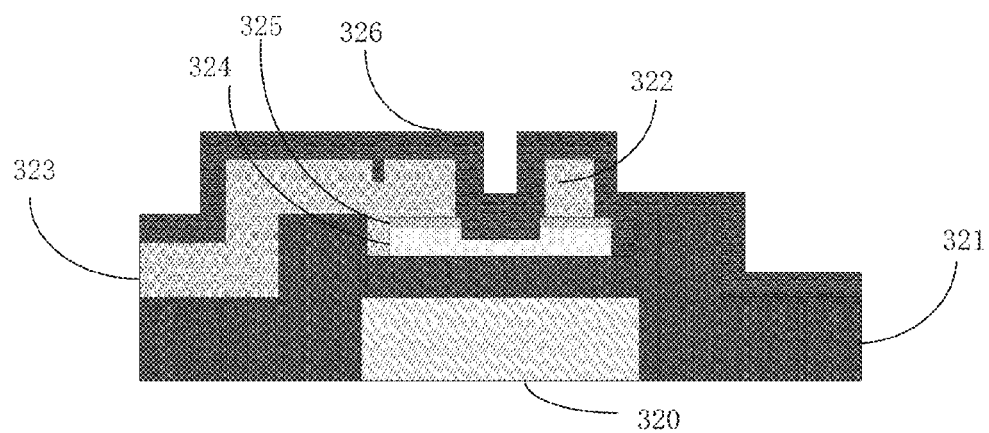
FIG. 7 is a cross-section schematic view along line B-B' in FIG. 5.

Referring to FIG. 7, the sub-pixel portion 102 has a second thin film transistor 32 and a second pixel electrode, wherein a second insulation layer 321 is disposed between a second grid electrode 320 of the second thin film transistor and a second source electrode 322 and a second drain electrode 323 of the second thin film transistor; the second source electrode 322 is connected to the second drain electrode 323 through a semiconductor layer 324; and the material of the semiconductor layer is an amorphous silicon material. Furthermore, an ohmic contact layer 325 is disposed on an upper surface of the semiconductor layer 324, and a passivation layer 326 is disposed on upper surfaces of the second source electrode 322 and the second drain electrode 323.

The first grid electrode of the first thin film transistor 31 is connected to a scan line 11, and the second grid electrode of the second thin film transistor 32 is connected to the same. The first source electrode of the first thin film transistor 31 is connected to a data line 12, and the second source electrode of the second thin film transistor 32 is connected to the same. The first drain electrode of the first thin film transistor 31 is connected to the first pixel electrode by a through-hole 18, and the second drain electrode of the second thin film transistor 32 is connected to the second pixel electrode by a through-hole 19. Additionally, a com line is labeled as 13.

A first distance is a thickness of the first insulation layer 311 which is between the first grid electrode 310 of the first thin film transistor 31 and the semiconductor layer 314 of the first thin film transistor 31. A second distance is a thickness of the second insulation layer 321 which is between the second grid electrode 320 of the second thin film transistor 32 and the semiconductor layer 324 of the second thin film transistor 32, wherein the first distance is unequal to the second distance.

In the preferred embodiment, the second distance is smaller than the first distance. As shown in FIG. 7, a thinning operation is processed on the second insulation layer 311 which is between the second grid electrode 320 and the semiconductor layer 324 of the second thin film transistor, so as to form the second insulation layer 321 between the second grid electrode and the semiconductor layer 324 of the second thin film transistor.

The thinning operation can be wet etching or dry etching. After the thinning operation, a ratio of the second distance to the first distance is in the range of 0.5-0.8. The charge efficiency of the thin film transistor is an inverse ratio of the thickness of the insulation layer, less thickness means more charge efficiency. Therefore, when under the same driving data signal, because the first distance is larger than the second distance, the voltage of the first pixel electrode of the main pixel portion 101 is smaller than the voltage of the second pixel electrode of the sub-pixel portion 102, so that the voltage of a first liquid crystal capacitor of the main pixel portion 101 is smaller than the voltage of a second liquid crystal capacitor of the sub-pixel portion 102. Therefore, the brightness of the pixel of the main pixel portion 101 is different from the brightness of the pixel of the sub-pixel portion 102, so as to solve the color cast problem from a large viewing angle.

Another method to achieve the embodiment is that a thickening operation is processed on the first insulation layer which is between the second grid electrode and the semiconductor layer of the second thin film transistor, so as to form the second insulation layer between the second grid electrode and the semiconductor layer of the second thin film transistor. The thickening operation can be deposition or sputter. After the thickening operation, the second distance is larger than the first distance, and a ratio of the second distance to the first distance is in the range of 1.3-1.8.

The present invention provides a display panel, wherein the insulation layer of the main pixel portion and the sub-pixel portion are designed to be different thicknesses, so that the charge efficiency of the pixel electrode of the main pixel portion and the sub-pixel portion are different, and then the brightness of the pixel of the main pixel portion and the sub-pixel portion are also different, so as to decrease the color cast problem from a large viewing angle, improve the watching effect, and lower the production cost.

The present invention further provides a display device, which comprises: a display panel;
wherein the display panel comprises an array substrate;
wherein the array substrate comprises data lines, scan lines, and a plurality of pixel units formed by crisscrossing the data lines and scan lines;
wherein each of the pixel units comprises:
a main pixel portion having a first thin film transistor, wherein a first insulation layer is disposed between a first grid electrode of the first thin film transistor and a first source electrode and a first drain electrode of the first thin film transistor; and the first source electrode is connected to the first drain electrode through a semiconductor layer; and
a sub-pixel portion having a second thin film transistor, wherein a second insulation layer is disposed between a second grid electrode of the second thin film transistor and a second source electrode and a second drain electrode of the second thin film transistor; and the second source electrode is connected to the second drain electrode through another semiconductor layer;
wherein a second distance is unequal to a first distance, wherein the first distance is a thickness of the first insulation layer which is between the first grid electrode of the first thin film transistor and the semiconductor layer of the first thin film transistor; and the second distance is a thickness of the second insulation layer which is between the second grid electrode of the second thin film transistor and the semiconductor layer of the second thin film transistor.

It is possible for the display panel of the display device of the present invention to be any one of the two above-mentioned embodiments. Since the display panels have been described in detail, they are not repeated here again.

The present invention provides a display device, wherein the insulation layer of the main pixel portion and the sub-pixel portion are designed to be different thicknesses, so that the charge efficiency of the pixel electrode of the main pixel portion and the sub-pixel portion are different, and then the brightness of the pixel of the main pixel portion and the sub-pixel portion are also different, so as to decrease the color cast problem from a large viewing angle, improve the watching effect, and lower the production cost.

As described above, the present invention has been described with a preferred embodiment thereof and it is understood that many changes and modifications to the described embodiment can be carried out without departing from the scope and the spirit of the invention that is intended to be limited only by the appended claims.

What is claimed is:

1. A display panel, comprising: an array substrate;
   wherein the array substrate comprises data lines, scan lines, and a plurality of pixel units formed by crisscrossing the data lines and scan lines;
   wherein each of the pixel units comprises:
   a main pixel portion having a first thin film transistor, wherein a first insulation layer is disposed between a first grid electrode of the first thin film transistor and a first source electrode and a first drain electrode of the first thin film transistor; and the first source electrode is connected to the first drain electrode through a semiconductor layer;
   a sub-pixel portion having a second thin film transistor, wherein a second insulation layer is disposed between a second grid electrode of the second thin film transistor and a second source electrode and a second drain electrode of the second thin film transistor; and the second source electrode is connected to the second drain electrode through another semiconductor layer;
   wherein a second distance is larger than a first distance; a ratio of the second distance to the first distance is in the range of 1.25-2; the first distance is a thickness of the first insulation layer which is between the first grid electrode of the first thin film transistor and the semi-conductor layer of the first thin film transistor; and the second distance is a thickness of the second insulation layer which is between the second grid electrode of the second thin film transistor and the semiconductor layer of the second thin film transistor.

2. The display panel according to claim 1, wherein the first insulation layer is formed by a thinning operation on the second insulation layer.

3. The display panel according to claim 1, wherein the material of the semiconductor layer is an amorphous silicon material.

4. A display panel, comprising: an array substrate;
wherein the array substrate comprises data lines, scan lines, and a plurality of pixel units formed by crisscrossing the data lines and scan lines;
wherein each of the pixel units comprises:
a main pixel portion having a first thin film transistor, wherein a first insulation layer is disposed between a first grid electrode of the first thin film transistor and a first source electrode and a first drain electrode of the first thin film transistor; and the first source electrode is connected to the first drain electrode through a semiconductor layer; and
a sub-pixel portion having a second thin film transistor, wherein a second insulation layer is disposed between a second grid electrode of the second thin film transistor and a second source electrode and a second drain electrode of the second thin film transistor; and the second source electrode is connected to the second drain electrode through another semiconductor layer;
wherein a second distance is unequal to a first distance; the first distance is a thickness of the first insulation layer which is between the first grid electrode of the first thin film transistor and the semiconductor layer of the first thin film transistor; and the second distance is a thickness of the second insulation layer which is between the second grid electrode of the second thin film transistor and the semiconductor layer of the second thin film transistor.

5. The display panel according to claim 4, wherein the second distance is larger than the first distance.

6. The display panel according to claim 5, wherein the first insulation layer is formed by a thinning operation on the second insulation layer.

7. The display panel according to claim 4, wherein the second distance is smaller than the first distance.

8. The display panel according to claim 7, wherein the second insulation layer is formed by a thinning operation on the first insulation layer.

9. The display panel according to claim 4, wherein a ratio of the second distance to the first distance is in the range of 0.5-2.

10. The display panel according to claim 4, wherein the material of the semiconductor layer is an amorphous silicon material.

11. A display device, comprising: a display panel;
wherein the display panel comprises an array substrate;
wherein the array substrate comprises data lines, scan lines, and a plurality of pixel units formed by crisscrossing the data lines and scan lines;
wherein each of the pixel units comprises:
a main pixel portion having a first thin film transistor, wherein a first insulation layer is disposed between a first grid electrode of the first thin film transistor and a first source electrode and a first drain electrode of the first thin film transistor; and the first source electrode is connected to the first drain electrode through a semiconductor layer; and
a sub-pixel portion having a second thin film transistor, wherein a second insulation layer is disposed between a second grid electrode of the second thin film transistor and a second source electrode and a second drain electrode of the second thin film transistor; and the second source electrode is connected to the second drain electrode through another semiconductor layer;
wherein a second distance is unequal to a first distance; the first distance is a thickness of the first insulation layer which is between the first grid electrode of the first thin film transistor and the semiconductor layer of the first thin film transistor; and the second distance is a thickness of the second insulation layer which is between the second grid electrode of the second thin film transistor and the semiconductor layer of the second thin film transistor.

12. The display device according to claim 11, wherein the second distance is larger than the first distance.

13. The display device according to claim 12, wherein the first insulation layer is formed by a thinning operation on the second insulation layer.

14. The display device according to claim 11, wherein the second distance is smaller than the first distance.

15. The display device according to claim 14, wherein the second insulation layer is formed by a thinning operation on the first insulation layer.

16. The display device according to claim 11, wherein a ratio of the second distance to the first distance is in the range of 0.5-2.

17. The display device according to claim 11, wherein the material of the semiconductor layer is an amorphous silicon material.

* * * * *